(12) United States Patent
Johnson

(10) Patent No.: US 9,812,867 B2
(45) Date of Patent: Nov. 7, 2017

(54) CAPACITOR ENHANCED MULTI-ELEMENT PHOTOVOLTAIC CELL

(71) Applicant: Neldon P. Johnson, Deseret, UT (US)

(72) Inventor: Neldon P. Johnson, Deseret, UT (US)

(73) Assignee: Black Night Enterprises, Inc., Charleston, Nevis ( * ) Notice: Subject to any disclaimer, the term of this patent is extended or adjusted under 35 U.S.C. 154(b) by 375 days.

(21) Appl. No.: 14/738,138

(22) Filed: Jun. 12, 2015

(65) Prior Publication Data

US 2016/0365730 A1    Dec. 15, 2016

(51) Int. Cl.
| | |
|---|---|
| *H02J 3/38* | (2006.01) |
| *H02S 40/38* | (2014.01) |
| *H02J 7/35* | (2006.01) |
| *H01L 31/043* | (2014.01) |

(52) U.S. Cl.
CPC ............ *H02J 3/383* (2013.01); *H01L 31/043* (2014.12); *H02J 7/35* (2013.01); *H02S 40/38* (2014.12); *Y02E 10/563* (2013.01); *Y02E 10/566* (2013.01)

(58) Field of Classification Search
CPC ................................ H02J 3/383; H01L 31/043
See application file for complete search history.

(56) References Cited

U.S. PATENT DOCUMENTS

| | | |
|---|---|---|
| 4,533,783 A | 8/1985 | Benjamin et al. |
| 4,577,052 A | 3/1986 | Schutten et al. |
| 4,791,528 A | 12/1988 | Suzuki et al. |
| 6,081,017 A | 6/2000 | Kim et al. |
| 6,121,541 A | 9/2000 | Arya |
| 6,365,825 B1 | 4/2002 | Hayashi |
| 6,368,892 B1 | 4/2002 | Arya |
| 7,638,707 B2 | 12/2009 | Shinohara |
| 7,741,144 B2 | 6/2010 | Choi et al. |
| 7,919,953 B2 | 4/2011 | Porter et al. |
| 7,944,091 B2 * | 5/2011 | Zacharias ............... H02M 7/48 307/112 |
| 8,097,803 B2 | 1/2012 | Chang et al. |
| 8,203,071 B2 | 6/2012 | Sheng et al. |
| 8,217,258 B2 | 7/2012 | El-Ghoroury et al. |
| 8,541,783 B2 | 8/2013 | Saito et al. |

(Continued)

FOREIGN PATENT DOCUMENTS

| | | |
|---|---|---|
| EP | 0392676 A2 | 10/1990 |
| EP | 1673790 A1 | 12/2005 |

(Continued)

*Primary Examiner* — Thienvu Tran
*Assistant Examiner* — Pinping Sun
(74) *Attorney, Agent, or Firm* — J. David Nelson

(57) ABSTRACT

A multi-element photovoltaic cell having two or more photovoltaic elements with an isolation layer interposed between all contiguous photovoltaic elements. Each photovoltaic element has an element front conductor and an element rear conductor which are in electrical contact with the photovoltaic layer of the photovoltaic element. The current from a respective photovoltaic element which is generated as incident solar radiation irradiates the photovoltaic cell, flows independently of the other photovoltaic elements to one or more capacitor banks controlled by a photovoltaic controller. The photovoltaic controller controls charging and discharging of element capacitors of the capacitor banks so as to optimize the efficiency of the photovoltaic cell.

36 Claims, 7 Drawing Sheets

(56) References Cited

U.S. PATENT DOCUMENTS

| | | |
|---|---|---|
| 8,536,444 B2 | 9/2013 | El. Ghoroury et al. |
| 8,592,249 B1 | 11/2013 | Neilson et al. |
| 8,604,330 B1 | 12/2013 | Hennessy et al. |
| 8,609,984 B2 | 12/2013 | Bhattacharya et al. |
| 8,624,294 B2 | 1/2014 | Kline |
| 2003/0015700 A1 | 1/2003 | Eisenbeiser et al. |
| 2004/0264225 A1* | 12/2004 | Bhavaraju ............... G05F 1/67 363/120 |
| 2008/0246339 A1* | 10/2008 | Rodas ..................... H02J 7/35 307/64 |
| 2009/0039826 A1* | 2/2009 | Yeh ......................... H02J 7/345 320/101 |
| 2010/0313934 A1 | 12/2010 | Vaananen |
| 2011/0146755 A1* | 6/2011 | Curran ................. H01L 27/302 136/246 |
| 2011/0228578 A1* | 9/2011 | Serpa ..................... H02M 3/158 363/132 |
| 2012/0043818 A1* | 2/2012 | Stratakos ................ H02J 3/383 307/77 |
| 2012/0310438 A1 | 12/2012 | Kaiser |
| 2013/0049673 A1* | 2/2013 | Agarwal ................ H02J 7/0016 320/101 |
| 2013/0061914 A1 | 3/2013 | Young |
| 2014/0048900 A1 | 2/2014 | Keysar et al. |
| 2014/0197795 A1* | 7/2014 | Crebier ................. H02J 7/0018 320/118 |
| 2014/0368058 A1* | 12/2014 | Orr ................... H01L 31/02021 307/115 |
| 2015/0108939 A1 | 4/2015 | Johnson |

FOREIGN PATENT DOCUMENTS

| | | |
|---|---|---|
| EP | 1727167 A2 | 11/2006 |
| EP | 2141746 A2 | 1/2010 |
| EP | 2367017 A2 | 9/2011 |
| EP | 1958486 B1 | 10/2011 |
| WO | WO2003017446 A1 | 3/2003 |
| WO | WO2012144534 A1 | 3/2003 |
| WO | WO 2009011794 A2 | 1/2009 |

* cited by examiner

CAPACITOR ENHANCED MULTI-ELEMENT PHOTOVOLTAIC CELL

BACKGROUND OF THE INVENTION

This invention is in the field of photovoltaic cells and in particular in the field of multi-junction, multi-element photovoltaic cells.

Photons of incident solar radiation strike the photovoltaic cells of a solar panel and are absorbed by semiconducting materials, such as silicon. A common type of photovoltaic cell is a single layer silicon cell made from a semiconductor wafer. The photovoltaic material of a photovoltaic cell is commonly formed by doping a thin layer at the top and bottom of the silicon layer of the cell, producing a pn-junction with a particular bandgap energy, $E_g$. The silicon layer has metallic contacts on the top and bottom. Photons of the incident solar radiation may be reflected or transmitted into the cell. Each of the transmitted photons gives up its energy to an electron, if the energy of the photon is equal to or greater than the bandgap energy, resulting in electrons being excited from their atomic or molecular orbits by the photons, generating electron-hole pairs. Excited electrons and holes respectively travel towards n-doped and p-doped regions at the top and bottom of the layer and to electrodes of the cell, resulting in a generation photocurrent $I_g$. Voltage across the cell is generated from the incident solar radiation which results in the $I_g$, which is a direct current (DC), and the energy of the direct current can be stored in batteries, capacitors or other energy storage processes. The direct current may also be converted to alternating current and discharged to a grid.

The maximum theoretical efficiency of traditional single-junction cells is 34%. This is known as the Shockley-Queisser limit. This limit is based on several loss mechanisms that are inherent to any solar cell. One type of loss is the blackbody radiation loss which accounts for about 7% of the power loss. A second type of loss is known as "recombination", which accounts for about 10% of the power loss, and results from the electrons created by the photoelectric effect being captured in the electron holes left behind by previous photon-electron excitations. A third and principal loss mechanism results from bandgap limitations, i.e. result from the fact that a photon must have enough energy to exceed the bandgap energy of the material, or it will not excite an electron from its orbit. Bandgap limitations are a major problem for single layer, single junction solar cells. For instance, depending on the semiconductor material used for the cell, the cell may not be responsive to a large portion of the infrared spectrum, which represents almost half of the energy of incident solar radiation. Also, a fourth type of loss, referred to as "relaxation," may occur when photons with a higher energy level than the bandgap excite electrons well above the bandgap and the extra energy is lost through electron collisions. This relaxation energy loss is in the form of heat in the cell which may further increase blackbody losses.

All of the losses total at least 66% of the energy of the incident solar radiation. Other design concerns, such as reflection off the front surface or the metal terminals, further reduce efficiency. The best presently commercially available single layer/single junction cells have an efficiency of about 25%.

Multi-junction solar cells are solar cells of multiple layers of differing semiconductor materials with multiple p-n junctions. The p-n junction of each layer will produce electric current in response to a different bandwidth of radiation, resulting in the cell producing electric current in response to multiple bandwidths of radiation. Although as discussed above, a single layer cell has a 34% efficiency limit, multiple layer/junction cells have a theoretical efficiency limit of approximately 87% corresponding to an infinite number of layers/junctions. The higher the number of layers, the higher the theoretical efficiency limit of the cell. However, there is an exponential relationship between theoretical efficiency and the number of layers/junctions required. While multi-junction/layer cells with efficiencies exceeding 40% are commercially available, the cost/performance ratio of single layer cells has been generally better than the multi-junction cells presently available.

Multi-junction cells typically have a layer with the shortest wavelength bandgap as the top layer, with the wavelength bandgap of the subsequent layers progressively increasing from the top layer to the bottom layer. Transparent conductors are required to provide for unabsorbed radiation passing each layer to be transmitted to the next layer. Multi-junction cells are difficult to produce because of the thinness of the materials and the difficulties with extracting the current between the layers. Amorphous silicon cells, which are mechanically separate but electrically connected address this issue.

A monolithically integrated cell having multiple layers that are mechanically and electrically connected, is difficult to produce. Since the layers are connected in series, the same current must flow through each junction, and if the photocurrents generated in each layer are not matched, electrons will be absorbed between layers. Bandgaps of each layer must be chosen to balance the current generation in each layer.

For a typical three layer, multi-junction photovoltaic cell, the top layer may be designed to absorb a portion of the ultraviolet spectrum and perhaps a portion of the visible light spectrum, and to pass the remaining wave lengths of visible light and infrared. A second layer may be designed to absorb the visible light passed by the top layer and to pass infrared. A third layer may be designed to absorb as much of the shorter wavelength infrared spectrum as practical. Each of the three layers must be comprised of material specifically selected and must be designed to produce as close as possible the same photocurrent as the other two layers for the radiation absorbed in its layer bandgap.

Solar concentrators, such as Fresnel lenses and parabolic reflective lenses can be used to increase the cost/efficiency ratio of a photovoltaic solar collector. The multiplier on the solar radiation concentration provided by the concentrator lens, particularly if the lens is equipped with solar tracking, may offset the cost/efficiency disadvantage of the multi-junction photovoltaic cells. Accordingly, much of multi-junction photovoltaic cell research involves use with solar concentrators.

The difficulty in matching the photocurrent produced by each layer of a multi-layer photovoltaic cell is further complicated by the variations in the power distribution over the overall operating spectrum range, the "overall bandgap," for which energy is intended to be absorbed by the photovoltaic cell. Significant variations in the power distribution among the ultraviolet, visible light, and infrared spectrums occur with variations in the time of day, season, latitude, altitude, and cloud cover. Even variations in atmospheric pressure and humidity may significantly affect the power distribution over the overall bandgap. Photovoltaic layer material selection and layer design for a sea level, equatorial, frequent cloud cover, and high humidity application, may be poorly suited for a high latitude, high altitude, clear sky, and low humidity application. Further, a photovoltaic cell with material and layer design selected to optimize efficiency during a particular season, may result in a substantially reduced efficiency during other seasons, when the power distribution within the overall bandgap will be substantially different. Still further, a photovoltaic cell which has its layer material and layer design selections made based upon a particular time of day, i.e. optimized based upon the power distribution within the overall bandgap during a particular time of day, for example solar noon, may result in substantially diminished efficiency during other times of day, particularly the early morning and later afternoon hours. In each operating condition, the photocurrent produced by the least productive photovoltaic layer will determine the cell output photocurrent, and hence the power output and efficiency of the photovoltaic cell.

One solution to this problem of photocurrent differential between layers is to physically and electrically isolate the photovoltaic layers and to combine the current from each layer outside the photovoltaic cell. This is referred to as an amorphous photovoltaic cell.

Another inherent problem affecting the efficiency of a photovoltaic cell, or a photovoltaic layer of a multi-layer cell is related to the output voltage range of the layer. Referring to FIG. 4, the instantaneous current I 71 generated by each photovoltaic cell layer and flowing from the photovoltaic cell layer will be dependent upon the extent of the irradiation of the photovoltaic cell layer, the characteristics of the photovoltaic cell layer, and the instantaneous voltage V 73 of the circuit to which the current is being discharged by the photovoltaic cell layer. For a multi-layer cell, the foregoing is true of each layer.

The formula for the instantaneous power (P) generated by the photovoltaic cell may be determined by the formula P=I*V. The I and V values at which the maximum power $P_{max}$ 79 is generated are I=$I_{mp}$ 81 and V=$V_{mp}$ 77 respectively. I is at its maximum $I_{ov}$ 78 when the voltage in the circuit to which the photovoltaic cell layer is being discharged is zero. In the case of a photovoltaic cell layer producing charge that is stored in a capacitor, the maximum current occurs when there is no charge on the capacitor. As the V to which the photovoltaic cell layer is subjected by the capacitor charging circuit, increases above $V_{mp}$, the current produced by the photovoltaic cell layer decreases rapidly and goes to zero at the voltage reaches the shut-off voltage ($V_s$). During any time period that V in the circuit to which the photovoltaic cell layer or the photovoltaic array as a whole, is discharging current, exceeds $V_{mp}$, the efficiency of the photovoltaic cell layer or photovoltaic array as a whole will be significantly diminished.

Energy from a photovoltaic system is generally stored in batteries for later use or converted to an AC current for discharge to an electrical grid. If the energy is to be stored in a battery, the voltage for the photovoltaic system will have to be adjusted to exceed the transient voltage of the battery. Since the maximum voltage output of a photovoltaic cell or a photovoltaic cell layer of a multi-layer photovoltaic cell, is typically on the order of 0.5 volts, the voltage must be stepped up before the energy can be stored in a battery system. Similarly, if the energy generated by a photovoltaic cell is to be discharged to an electrical grid system, which may be operated at 240 volts, 480 volts, or much higher voltages, the voltages must be stepped up to a voltage exceeding the minimum voltage required by an inverter which will invert the DC current to a pulsed AC current. Various filters may be used to impose a sinusoidal wave form on the AC.

To maximize the efficiency of a multi-layer photovoltaic cell, the problem of mismatched photocurrent of the photovoltaic layers of a monolithically integrated photovoltaic cell, and the problem of the photocurrent being reduced as the discharge voltage increases on the photovoltaic cell, must be addressed.

For purposes of this application, including but not limited to, the Summary of the Invention, the Brief Description of the Drawings, the Detailed Description, the Claims, and the Abstract, the term "photovoltaic layer" shall be defined to include a layer of material having the characteristic and ability to receive and absorb electromagnetic radiation and to generate a current, namely a photocurrent, through the absorption of the electromagnetic radiation; the term "photovoltaic element" shall be defined to include a photovoltaic layer and one or more other functional layers or components, such as window layers, anti-reflective coatings, conduction layers, or metallic contacts; and the term "multi-element photovoltaic cell" shall be defined to include a photovoltaic cell having two or more photovoltaic elements. The term "electromagnetic radiation" includes particularly the ultraviolet, visible light and infrared spectrums respectively.

An objective of the present invention is to provide a multi-element photovoltaic cell having a photovoltaic controller, which provides for the continuous production of current by each of the irradiated photovoltaic cells of a photovoltaic array regardless of the level of irradiation.

A further objective of the device and method of the present invention is to provide for the continuous production of current by a photovoltaic cell by avoiding increasing the voltage of the discharge circuit, at each of the photovoltaic cells, above $V_{mp}$.

A further objective of the present invention is to provide for the continuous and optimized production of energy by each of the photovoltaic elements of a photovoltaic cell assembly while simultaneously stepping up the voltage of an aggregate current discharged by the photovoltaic cell assembly to a level required for discharge to an inverter or to a DC battery storage system, or both.

A further objective of the present invention is to provide for the continuous and optimized production of energy by each of the photovoltaic cells of a photovoltaic array while simultaneously stepping up the voltage of an aggregate current discharged by the full photovoltaic array to a level required for discharge to an inverter or to a DC battery storage system, or both.

SUMMARY OF THE INVENTION

The multi-element photovoltaic cell of the present invention may have two or more photovoltaic elements with an isolation layer interposed between all contiguous photovoltaic elements. Also, regardless of the number of photovoltaic elements, each photovoltaic element will have an element front conductor and an element rear conductor which are in electrical contact with the photovoltaic layer of the photovoltaic element. There may also be an anti-reflective coating at the element front of each photovoltaic element. A rear insulation layer may electronically isolate the multi-element photovoltaic cell from its environment.

The first element front conductor must be optically transparent, including the ultraviolet and infrared wavelengths within the overall bandgap, and must be electrically conductive. It should have a high transmissivity for the portion of the electromagnetic radiation spectrum to be used for power generation, namely the portion of the incident solar radiation having a wavelength falling within the overall bandgap radiation for the photovoltaic cell, which includes the bandgap radiation falling within the element bandgap for each photovoltaic element.

Regardless of the number of photovoltaic elements, each element front conductor and each element rear conductor should have a high transmissivity for the transient bandgap radiation that it must pass to the following photovoltaic elements, with the exception of the last rear conductor of the last photovoltaic element.

Whether the photovoltaic cell is a two element cell, a three element cell, or has more than three elements, for a preferred embodiment of the photovoltaic cell assembly of the present invention, the current from a respective photovoltaic element which is generated as incident solar radiation irradiates the photovoltaic cell, flows independently of the other photovoltaic elements to at least one element capacitor.

Solar radiation, which may include visible light and portions of the ultraviolet spectrum and the infrared spectrum, is incident to the photovoltaic cell assembly which is comprised of a plurality of photovoltaic elements. The photons of the solar radiation strike the absorption medium in each of the photovoltaic elements, thereby resulting in the release of electrons by the absorption medium of the photovoltaic elements. The resultant current will continue so long as the receiving voltage of the receiving circuit is less than the shut-down voltage, and so long as the photovoltaic cell is being irradiated by incident solar radiation.

For certain preferred embodiments of the photovoltaic cell of the present invention a transparent conducting film, such as a transparent conducting oxide may be used for the element transparent conductors. Carbon nanotube networks graphene, or polymer networks are examples of materials that may also be used for one or more of the transparent conductors. Other materials of that type may be known to persons of skill in the art and other similar materials may likely be the result of future technological development.

An alternative to providing a transparent conducting film for the element conductors is to provide an element front conduction zone and an element rear conduction zone which are integral with the element. These respective conduction zones can be provided through a high or increased level of doping of the conduction zones thereby transforming the semiconductor material into a conduction zone. Isolation layers interposed between contiguous photovoltaic elements must a high transmissivity rate for the radiation that must be passed to the following photovoltaic elements, and must be electrically non-conductive.

A preferred embodiment of the photovoltaic controller circuit includes a photovoltaic controller, a capacitor network comprised of a plurality of capacitor banks. Each photovoltaic element is electrically connected to a capacitor bank by a capacitor charge circuit. Each of the capacitor banks may comprise a plurality of element capacitors. A capacitor voltage sensor may be connected to each element capacitor and continuously or frequently monitor the voltage across the capacitor.

The process of the selective and sequential charging and discharging of the respective element capacitors of each photovoltaic cell may thus be controlled by the photovoltaic controller, based upon the voltage monitored by the voltage sensors. The photovoltaic controller may cycle between the element capacitors based upon the level of irradiation of the photovoltaic cell, the resultant current production of the photovoltaic cell, and the voltages across the element capacitors as measured by the voltage sensors.

The capacitor switches as controlled by the photovoltaic controller can provide for the photovoltaic elements of the photovoltaic cell, to be connected in parallel and with selected element of other cells to equalize the voltage before they are switched to discharge in series, providing for stepping up the voltage. If not equalized, the lowest voltage differential would determine the current.

The output circuit provides for each photovoltaic element to be connected in series or parallel. For a preferred embodiment, the capacitor switches may be operated by the photovoltaic controller to provide for each group of photovoltaic element capacitors that are to be discharged in series, to be first connected in parallel to provide for equalization of the voltage on each capacitor. This prevents the lowest voltage capacitor in the series from limiting the current when the capacitors are switched to discharging in series.

For capacitors connected in series, the current is the same at all points in the interconnecting circuit, and thus the current is the same to and from each capacitor. If independently charged capacitors are switched to series connection, the capacitor with the least voltage differential between the cathode and the anode at the time of the initial switching to a series configuration will determine the current flow from the series of capacitors. Further, the total charge discharged from the capacitor series, will be limited to the total charge stored in the capacitor of the series with the least total charge. Therefore, in order to maximize the discharge current and total charge discharged from independently charged capacitors of the same characteristics and capacitance, and hence the total energy discharged, the capacitors should be connected in parallel, immediately before connecting them in series, for equalization of the voltage and charge stored on each of the capacitors.

It is anticipated, based upon current technology, that the capacitors, switches, voltage sensors, and circuit connections between these components, will be components of an integrated circuit in which the photovoltaic cells are imbedded. The utilization of additional capacitors, switches and voltage sensors for embodiments with a larger number of capacitors for each photovoltaic cell, would certainly increase the cost of the photovoltaic controller of the present invention.

For preferred embodiments, the photovoltaic controller may receive continuous voltage measurements, or voltage measurements made at intervals, from the voltage sensors of each photovoltaic cell of a photovoltaic array, and use the voltage data to control the switches so as to attempt to optimize the output power production for the photovoltaic array, while providing for connecting the discharge output of each photovoltaic cell to the output circuit. The current flowing from each photovoltaic element, and each photovoltaic cell may also be measured continuously, or at intervals, by a cell current sensor, and the current data transmitted to the photovoltaic controller. This current data may be used, along with the voltage data, by the photovoltaic controller to attempt to optimize the output power production for each photovoltaic cell and for a photovoltaic array as a whole.

For a preferred embodiment, the photovoltaic controller may incorporate a digital computer and may communicate by wire or wireless with the capacitor voltage sensors to receive voltage measurements and may communicate by wire or wireless with the charge switches and the discharge switches to cause the switches to open and close as needed to manage the charging and discharging of the photovoltaic element capacitors so as to optimize the energy extraction of the photovoltaic array and to control the voltage and other characteristics of the output from the photovoltaic array so as to appropriately interface with storage, electric grid or other application for the extracted solar energy. For a preferred embodiment, the capacitor switches may be operated by the photovoltaic controller to provide for each group of photovoltaic element capacitors that are to be discharged in series, to be first connected in parallel to provide for equalization of the voltage on each capacitor. This prevents the lowest voltage capacitor in the series from limiting the current when the capacitors are switched to discharging in series.

The photovoltaic controller of the photovoltaic cell assembly of the present invention may also provide for the concurrent operation of a plurality of photovoltaic cell assemblies, such as would be present in a photovoltaic array. The photovoltaic cell assembly may receive voltage sensor signals from a plurality of other photovoltaic cell assemblies, such as for a photovoltaic array of which the photovoltaic cell assembly of the present invention is a component, and may generate charging signals and discharging switch control signals, which are directed to a plurality of photovoltaic cell assemblies of the present invention, as in a photovoltaic array. In general, the photovoltaic controller will operate element capacitor charging switches and element capacitor discharging switches for each of the photovoltaic cell assemblies so as to optimize the charge, power and total energy output of the photovoltaic array of which the photovoltaic cell assembly of the present invention is a component.

DETAILED DESCRIPTION OF PREFERRED EMBODIMENTS

Figure 1:
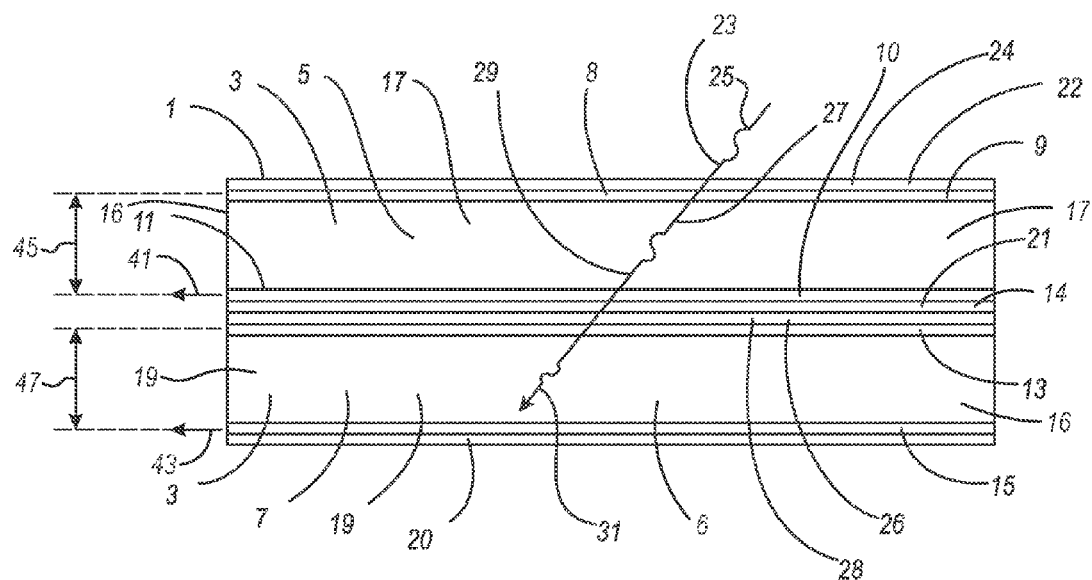
FIG. 1 is a cross-section illustration of a preferred embodiment of a multi-element photovoltaic cell of the present invention with two photovoltaic elements.

Referring first to FIG. 1, a schematic cross-section of a preferred embodiment of the multi-element photovoltaic cell 1 of the present invention, having two photovoltaic elements 3, a first photovoltaic element 5 and second photovoltaic element 7, which, for a multi-element photovoltaic cell 1 having two photovoltaic elements 3, is also the last photovoltaic element 6. A first element front conductor 9 and a first element rear conductor 11 are in electrical contact with the first photovoltaic layer 17. Likewise, a second element front conductor 13 and a second element rear conductor 15 are in electrical contact with the second photovoltaic layer 19. The first element front conductor 9, the first photovoltaic layer 17, and the first element rear conductor 11 comprise a photovoltaic element 3, namely the first photovoltaic element 5. The second element front conductor 13, the second photovoltaic layer 19, and the second element rear conductor 15 also comprise a photovoltaic element 3, namely the second photovoltaic element 7. Interposed between the contiguous first photovoltaic element 5 and second photovoltaic element 7 is an isolation layer 14, namely a first isolation layer 21.

For photovoltaic cells 1 having more than two photovoltaic elements 3, an isolation layer 14 is interposed between all contiguous photovoltaic elements 3. Also, regardless of the number of photovoltaic elements 3, each photovoltaic element will have an element front conductor 8 and an element rear conductor 10 which are in electrical contact with the photovoltaic layer 16 of the photovoltaic element 3.

There may also be a first anti-reflective coating 22 at the first element front 24 of the first photovoltaic element 5, and a second anti-reflective coating 26 at the second element front 28 of the second photovoltaic element 7. A rear insulation layer 20 may electronically isolate the multi-element photovoltaic cell 1 from its environment.

The first element front conductor 9 must be optically transparent, including the ultraviolet and infrared wavelengths within the overall bandgap, and electrically conductive. It should have a high transmissivity for the electromagnetic radiation 23 to be used for power generation, namely the portion of the incident solar radiation 25 having a wavelength falling within the overall bandgap, i.e. the overall bandgap radiation 27 for the photovoltaic cell, which includes the first bandgap radiation 29 falling within the first element bandgap for the first photovoltaic element 5, and the second bandgap radiation 31 falling within the second element bandgap for the second photovoltaic element 7. Similarly, the second element front conductor 13 should have a high transmissivity at least for the second bandgap radiation 31 providing for the portion of the incident solar radiation 25 having a wave length which falls within the second bandgap to pass to the second photovoltaic element 7.

For certain preferred embodiments of the photovoltaic cell 1 of the present invention a transparent conducting film, such as a transparent conducting oxide, which may be indium 10 oxide, fluorine doped 10 oxide, or doped zinc oxide. Carbon nanotube networks graphene, or polymer networks are examples of materials that may be used for the first element front conductor, first element rear conductor, and second element front conductor. Other materials of that type may be used for first element front conductor, first element rear conductor, and second element front conductor may be known to persons of skill in the art and other similar materials may likely be the result of future technological development.

Figure 2:
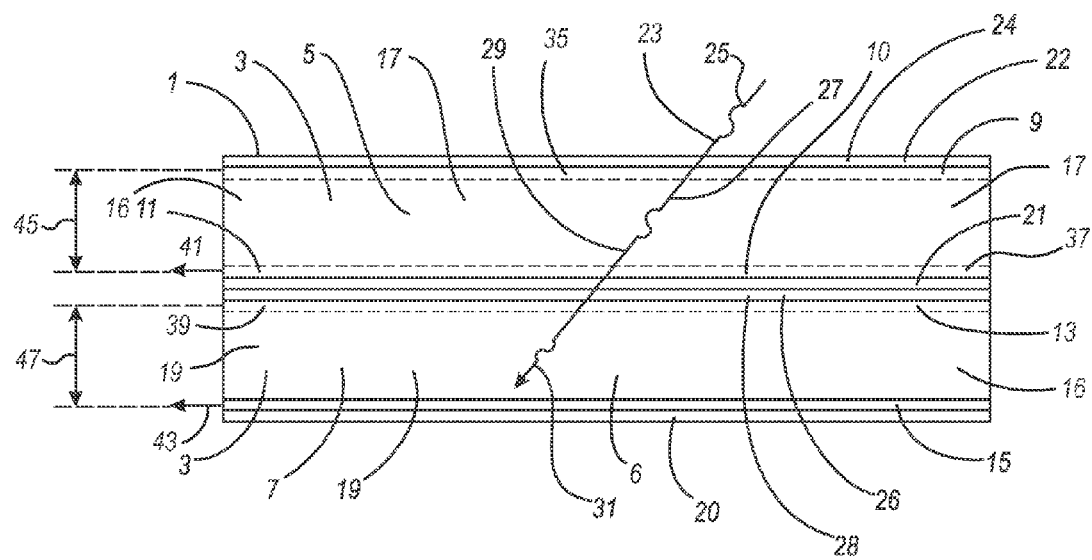
FIG. 2 is a cross-section illustration of a preferred embodiment of a multi-element photovoltaic cell of the present invention with two photovoltaic elements, the photovoltaic layers of each photovoltaic element having a doped conduction zone.

Referring now to FIG. 2, an alternative to providing a transparent conducting film for the first element front conductor 9, the first element rear conductor 11, and the second element front conductor 13, is to provide a first element front conduction zone 35 and a first element rear conduction zone 37 which are integral with the first photovoltaic layer 17, and to provide a second element front conduction zone 39 which is integral with the second photovoltaic layer 19. These respective conduction zones 35, 37, 39 can be provided through a high or increased level of doping of the conduction zones 35, 37, 39 of the first photovoltaic layer 17 and the second photovoltaic layer 19 respectively, thereby transforming the semiconductor material into conductive material.

Regardless of whether a separate transparent conducting layer, or an integral conducting layer is used, the first element current $I_1$ 41 and second element current $I_2$ 43 will be produced by the photovoltaic cell 1 at voltages V1 45 and V2 47 respectively.

Referring again to FIG. 1 for the embodiment of the photovoltaic cell 1 as shown, a first isolation layer 21 is interposed between the first element rear conductor 11 and the second element front conductor 13. This layer isolator 21 should have a high transmissivity rate, at least for the second bandgap radiation 31, and is electrically non-conductive.

Figure 3:
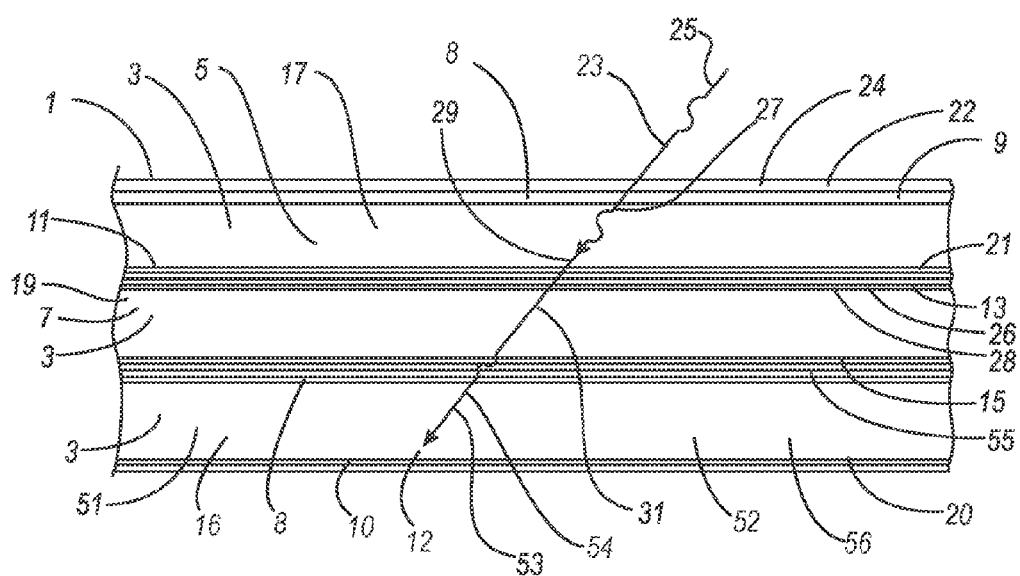
FIG. 3 is a cross-section illustration of a preferred embodiment of a multi-element photovoltaic cell of the present invention with three photovoltaic elements.

Referring now to FIG. 3, a photovoltaic cell 1 of the present invention having three photovoltaic elements 3 with three photovoltaic layers 16, namely a first photovoltaic element 5, a second photovoltaic element 7, and a third photovoltaic element 51 having a third photovoltaic layer 52 is shown. For this embodiment the second element rear conductor 15 and the second isolation layer 55 should have a high transmissivity for the third bandgap radiation 53 portion of the incident solar radiation 25. Regardless of the number of photovoltaic elements 3, each element front conductor 8 and each element rear conductor 10 should have a high transmissivity for the transient bandgap radiation 54 that it must pass to the following photovoltaic elements 3, with the exception of the last rear conductor 12 of the last photovoltaic element 56.

Figure 5:
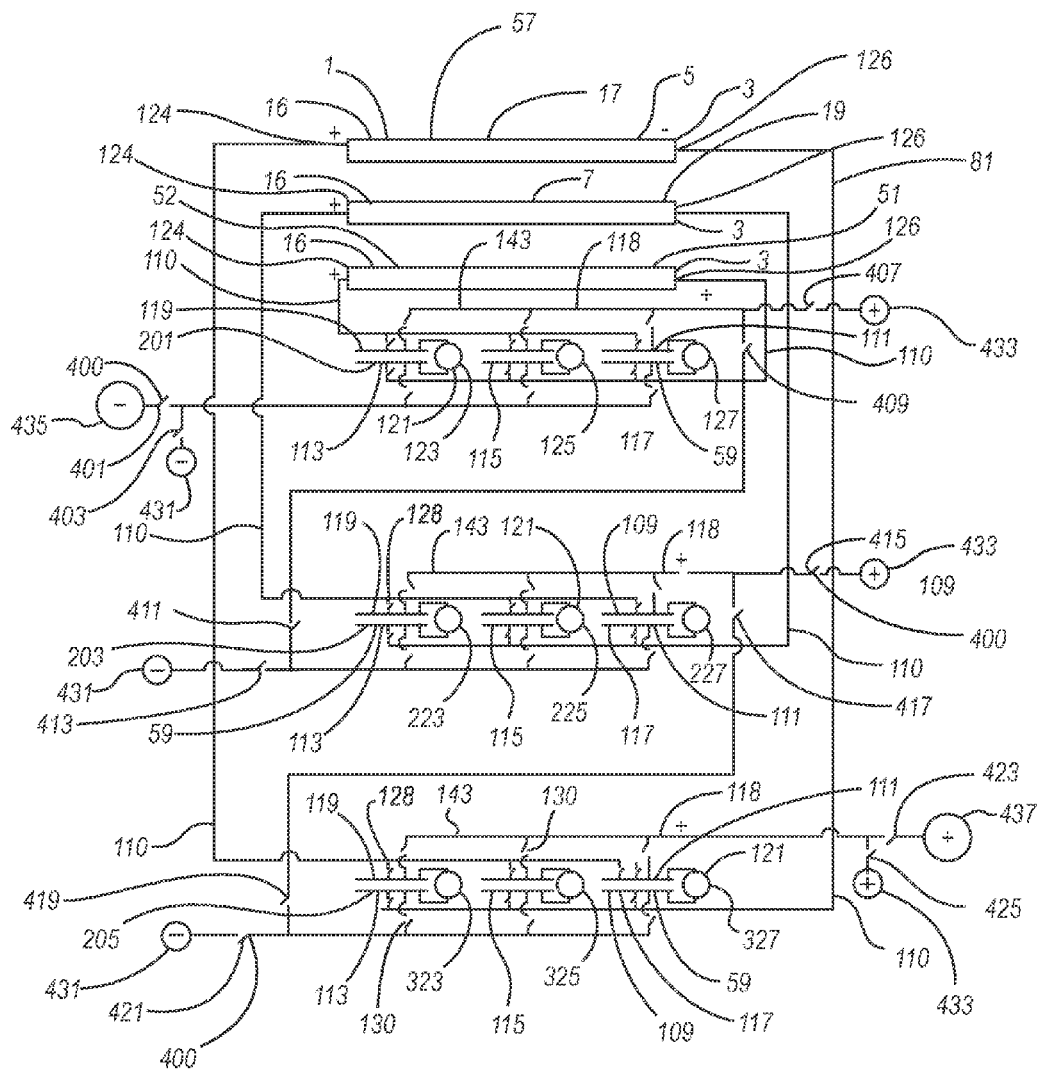
FIG. 5 is a circuit diagram of a preferred embodiment of a capacitor enhanced, multi-element photovoltaic cell of the present invention with the multi-element photovoltaic cell having three photovoltaic elements.

Referring now also to FIG. 5, whether the photovoltaic cell 1 is a two photovoltaic element cell as shown in FIG. 1, a three photovoltaic element cell is shown in FIG. 3, or has more than three photovoltaic elements, for a preferred embodiment of the photovoltaic cell assembly 57 illustrated in FIG. 5, the current from the photovoltaic layer 16 of a respective photovoltaic element 3, which is generated as incident solar radiation 25 as shown in FIG. 3 irradiates the photovoltaic cell 1, flows independently of the other photovoltaic layers 16 and photovoltaic elements 3, to at least one element capacitor 59.

Figure 4:
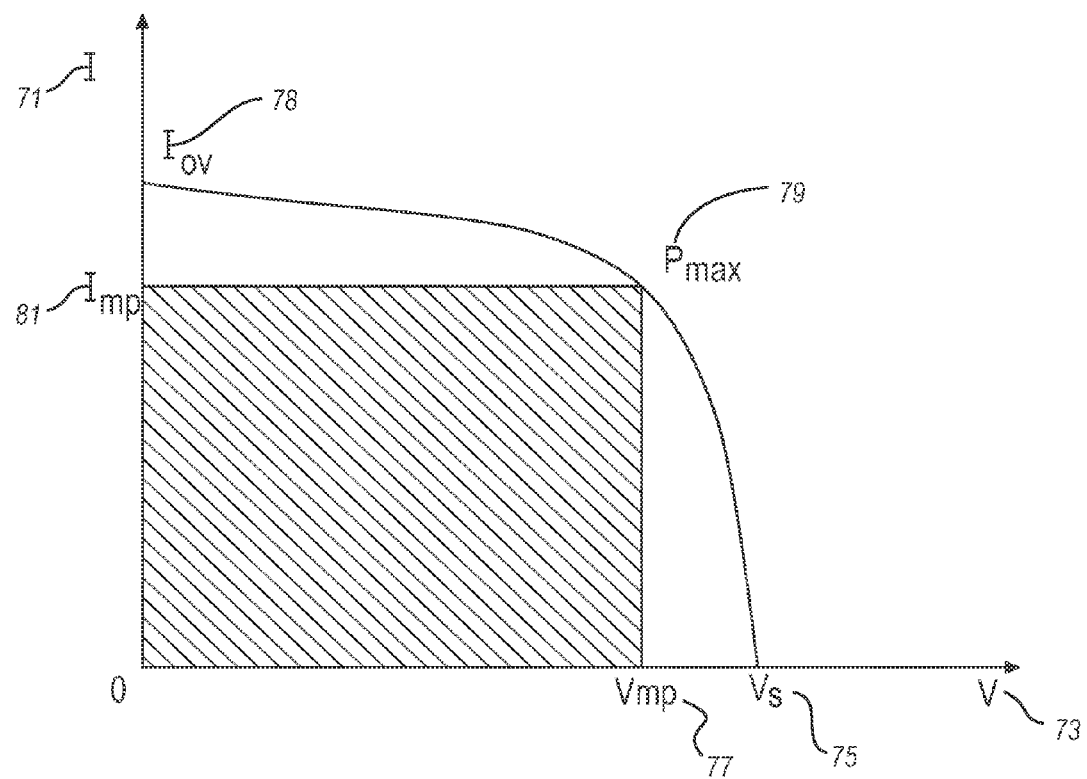
FIG. 4 is a graphical illustration of the relationship between the voltage in the discharge circuit and the current flowing from a photovoltaic element of a multi-element photovoltaic cell.

For the embodiment shown, solar radiation 25 as shown in FIG. 3, which may include visible light and portions of the ultraviolet spectrum and the infrared spectrum, is incident to the photovoltaic cell assembly 57. The photovoltaic cell assembly 57 is comprised of a plurality of photovoltaic elements 3. The photons of the solar radiation 25 strike the absorption medium of the photovoltaic layers 16 of each of the photovoltaic elements 3, thereby resulting in the release of electrons by the absorption medium of the photovoltaic layers 16 of the photovoltaic elements 3. Referring also to FIG. 4, the resultant current (I) 71 will continue so long as the receiving voltage (V) 73 of the receiving circuit 81 shown in FIG. 5 at the photovoltaic element 3 is less than the shut-down voltage ($V_s$) 75, as shown in FIG. 4, and so long as the photovoltaic cell 1 is being irradiated by incident solar radiation 25. A typical value for $V_s$ 75 is 0.5 volts and a typical value for $V_{mp}$ 77, the voltage when the power output of the photovoltaic cell is at a maximum $P_{max}$ 79, is 0.4 volts.

Figure 6:
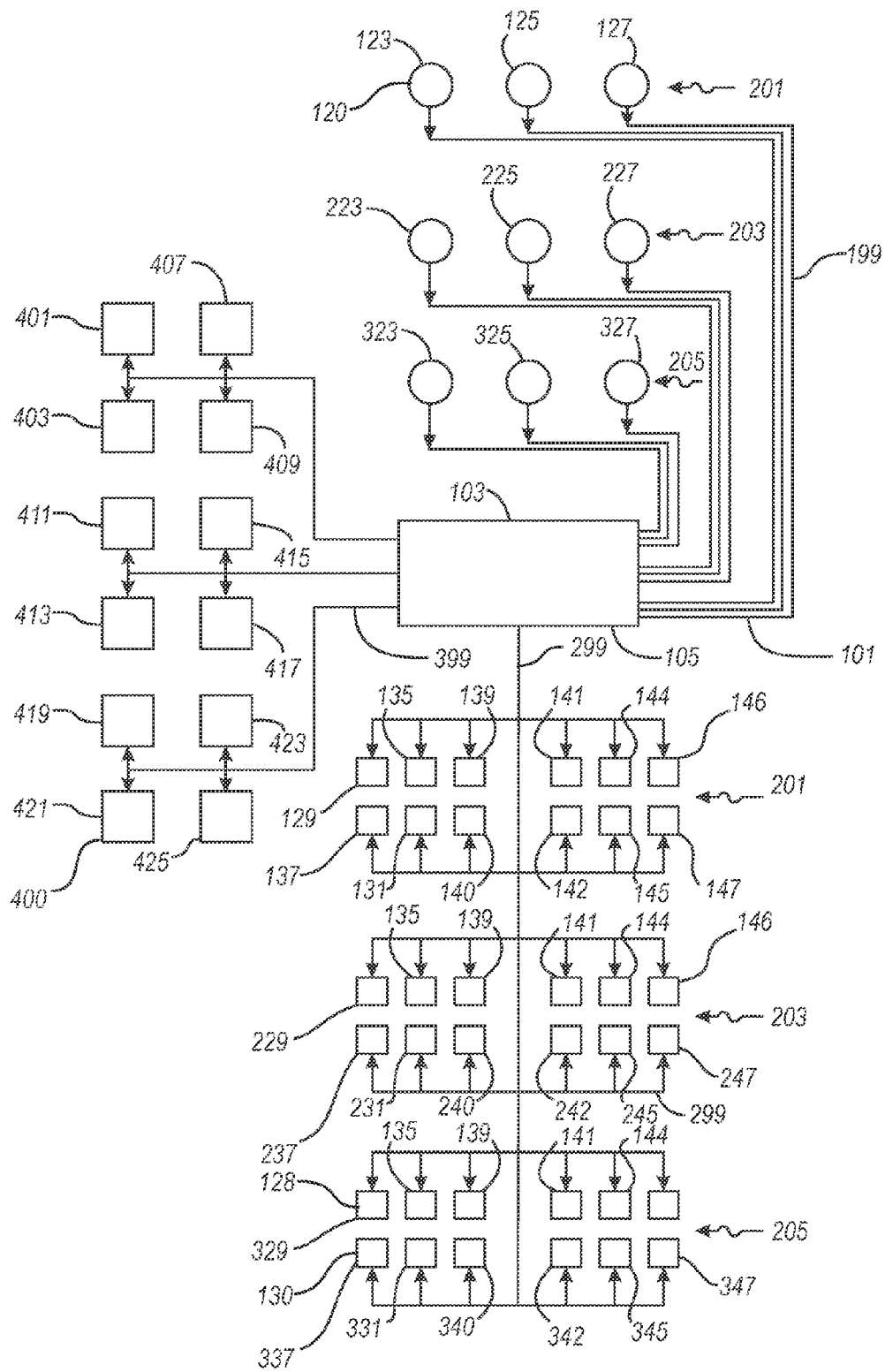
FIG. 6 is control schematic showing the photovoltaic controller and circuit components of a preferred embodiment of a capacitor enhanced, multi-element photovoltaic cell of the present invention with the multi-element photovoltaic cell having three photovoltaic elements.

Referring also to FIG. 6, FIG. 6 is a schematic detail of a preferred embodiment of a photovoltaic controller circuit 101 having a photovoltaic controller 103 which may be connected to the voltage sensors 120 by sensor communication 199, the capacitor charge switches 128 and the capacitor discharge switches 130 by capacitor switch communication 299, and the cell discharge switches 400 by cell discharge switch communication 399, each of which communications may be wire or wireless, for the photovoltaic cell 1. For the photovoltaic cell assembly 57 shown in FIG. 5, there is a capacitor network 109 comprised of three capacitor banks 111, a first capacitor bank 201, a second capacitor bank 203, and a third capacitor bank 205. Each photovoltaic element 3 of the photovoltaic cell 1 is electrically connected to a capacitor bank 111 by a capacitor charge circuit 110. Each photovoltaic element 3 has an element anode 124, which is a source of positive charge, and an element cathode 126, which is a source of negative charge for the current generated by the photovoltaic cell 1 during irradiation.

Figure 7:
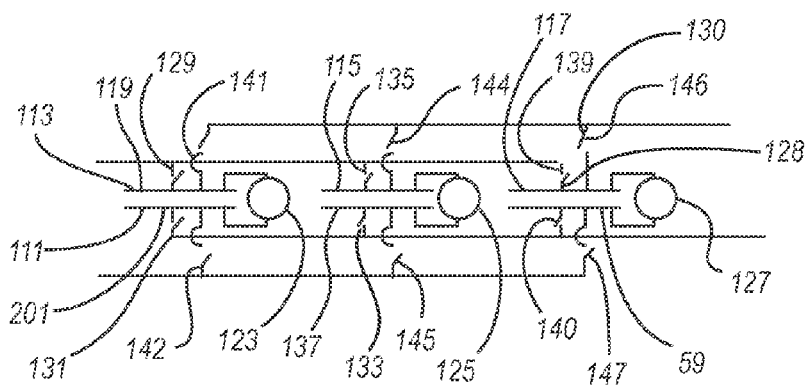
FIG. 7 is schematic detail of a typical first element capacitor bank for a photovoltaic cell having three photovoltaic elements with charge control circuit components for a preferred embodiment of a capacitor enhanced, multi-element photovoltaic cell of the present invention.
Figure 8:
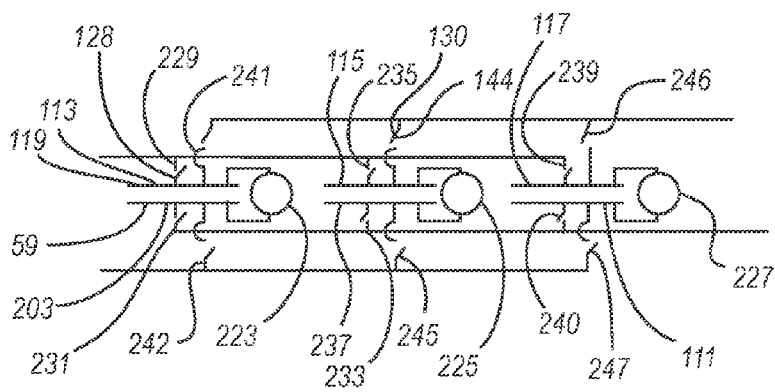
FIG. 8 is schematic detail of a typical second element capacitor bank for a photovoltaic cell having three photovoltaic elements with charge control circuit components for a preferred embodiment of a capacitor enhanced, multi-element photovoltaic cell of the present invention.
Figure 9:
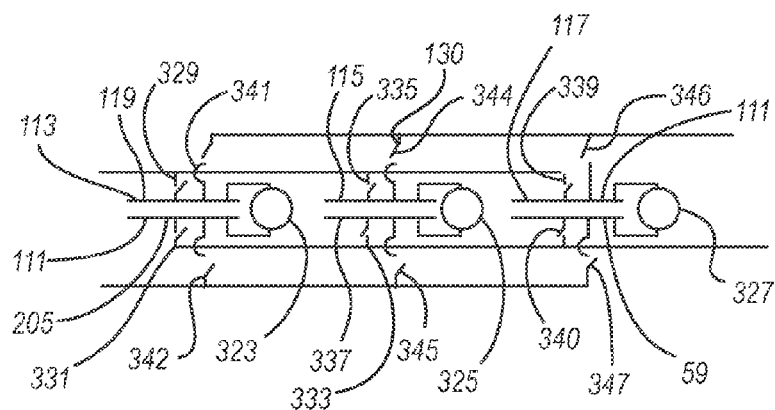
FIG. 9 is schematic detail of a typical third element capacitor bank for a photovoltaic cell having three photovoltaic elements with charge control circuit components for a preferred embodiment of a capacitor enhanced, multi-element photovoltaic cell of the present invention.

Each of the three capacitor banks 111, the first capacitor bank 201, the second capacitor bank 203, and the third capacitor bank 205, for the preferred embodiment of the photovoltaic controller circuit 101 shown in FIG. 5 and FIG. 6, comprises three element capacitors 119, a first element capacitor 113, a second element capacitor 115, and a third element capacitor 117. Each capacitor has two capacitor electrodes 112, a capacitor anode 114 which accumulates a positive charge and a capacitor cathode 116 which accumulates a negative charge. Referring also to FIGS. 7, 8, and 9, a capacitor voltage sensor 121 is connected to each element capacitor 119 and continuously or frequently monitors the voltage across the capacitor 119. For the embodiment shown, each capacitor bank 111 has a first voltage sensor 123, 223, 323 monitoring the voltage across the first element capacitor 113, a second voltage sensor 125, 225, 325 monitoring the voltage across the second element capacitor 115, and a third voltage sensor 127, 227, 327 monitoring the voltage across the third element capacitor 117, as shown in FIG. 5 and FIG. 6.

Referring further to FIGS. 6, 7, 8 and 9 when the photovoltaic element 3 is being irradiated by solar radiation 25, capacitor charge switches 128, namely the first capacitor first charge switch 129, 229, 329 and first capacitor second charge switch 131, 231, 331 of the capacitor charge circuit 110 may be closed by the photovoltaic controller 103, which allows a current to flow by the capacitor charge circuit 110 from the photovoltaic cell I to the first element capacitor 113. When the photovoltaic controller 103 determines, based upon the voltage sensed by the first voltage sensor 123, 223, 323 that the voltage across the first element capacitor 113 equals or exceeds a desired target maximum voltage, which may, for example, be $V_{mp}$ or 80% of $V_{mp}$, the first capacitor first charge switch 129, 229, 329 and first capacitor second charge switch 131, 231, 331 are opened, and capacitor discharge switches 130, the first capacitor first discharge switch 135, 235, 335 and the first capacitor second discharge switch 137, 237, 337 of the capacitor discharge circuit 118 are closed.

A second capacitor first charge switch 139, 239, 339 and a second capacitor second charge switch 140, 240, 340 of the capacitor charge circuit 110 are closed, and a second capacitor first discharge switch 141, 241, 341 and a second capacitor second discharge switch 142, 242, 342 are open, thereby providing for a current to flow by the capacitor discharge circuit 118 to the output circuit 143 from the first element capacitor 113 while current flows by the capacitor charge circuit 110 from the photovoltaic cell 1 to the second element capacitor 115, providing for uninterrupted current production by the photovoltaic cell 1.

When the voltage across the second element capacitor 115, as monitored by the second voltage sensor 125, 225, 325 equals or exceeds the desired target maximum voltage, the second capacitor first charge switch 139, 239, 339 and the second capacitor second charge switch 140, 240, 340 are opened, disconnecting the second element capacitor 115 from the photovoltaic cell 1, and a second capacitor first discharge switch 141, 241, 341 and a second capacitor second discharge switch 142, 242, 342 are opened, connecting the second element capacitor to the output circuit 143. The third element capacitor 117 is connected to the photovoltaic cell 1 by a third capacitor first charge switch 144, 244, 344 and a third capacitor second charge switch 145, 245, 345, again providing for the uninterrupted production of current by the photovoltaic cell. When the voltage across the third element capacitor 117, as monitored by the third voltage sensor 127, 227, 327, equals or exceeds the desired target maximum voltage, the third capacitor first charge switch 144, 244, 344 and the third capacitor second charge switch 145, 245, 345 are opened, disconnecting the third element capacitor 117 from the photovoltaic cell 1, and the third capacitor first discharge switch 146, 246, 346 and the third capacitor second discharge switch 147, 247, 347 are opened, connecting the third element capacitor to the output circuit 143. The first element capacitor 113 may be connected to the photovoltaic cell 1 and the cycle is started again.

The process of the selective and sequential charging and discharging of the respective element capacitors 119 of each photovoltaic cell 1 may thus be controlled by the photovoltaic controller 103, based upon the voltage monitored by the first voltage sensor 121, 221, 321, the second voltage sensor 123, 223, 323, and the third voltage sensor 125, 225, 325. The photovoltaic controller may cycle between the element capacitors 119 based upon the level of irradiation of the photovoltaic cell 1, the resultant current production of the photovoltaic cell 1, and the voltages across the element capacitors 119 as measured by the voltage sensors 120, namely voltage sensors 121, 221, 321, 122, 222, 223, 321, 322, 323. The photovoltaic controller 103 may control the charge switches For a preferred embodiment, the photovoltaic controller 103 may maintain the discharge switches, from the element capacitor 119 being discharged to the output circuit 143, open until the voltage across the element capacitor 119, as measured by a-voltage sensor, is zero or a selected minimum, until the charge switches for the element capacitor 119 are opened by the photovoltaic controller 103, or until such other time or occurrence as may be determined in accordance with a control algorithm.

The use of the three photovoltaic element capacitors 119, the first element capacitor 113, the second element capacitor 115, and the third element capacitor 117, for each capacitor bank 111, may provide for the availability of an adequately discharged photovoltaic capacitor for the receipt of current from the photovoltaic cell 1 when one or both of the other photovoltaic element capacitors 119 are still discharging current to the output circuit 143. However, simplified embodiments may utilize only two photovoltaic element capacitors 119 for each photovoltaic cell, and, for most applications, this may provide for adequate cycling of charging and discharging, so that the photovoltaic cell may achieve reasonably efficient and reasonably continuous production of current by the photovoltaic cell. Similarly, more complex and even more efficient embodiments may utilize four or more photovoltaic element capacitors 119 for each photovoltaic cell. While the embodiment shown in FIG. 5 and FIG. 6 with three capacitor banks 111 having three photovoltaic element capacitors 119 is believed by the applicant to provide a reasonable level of operational flexibility and efficiency for many applications, other applications may dictate the use of only two photovoltaic element capacitors 119 and other applications may dictate the use of four or more photovoltaic element capacitors 119.

The capacitor switches 128 as controlled by the photovoltaic controller 103 can provide for the photovoltaic elements 3 of the photovoltaic cell 1, to be connected in parallel and with selected element of other cells to equalize the voltage before they are switched to discharge in series, providing for stepping up the voltage. If not equalized, the lowest voltage differential would determine the current.

Referring again to FIG. 5, it will be noted that the output circuit 143 provides for each photovoltaic element 3 to be connected in series or parallel. Assume, for example, that the photovoltaic cell 1 is incorporated in a photovoltaic array of 800 photovoltaic cells 1 with 3 photovoltaic elements 3, each cell having element capacitors 119 which are voltage monitored, and the charging and discharging of the element capacitors 119 are controlled by the photovoltaic controller 103. Assume further, for example, that the voltage of the photovoltaic element capacitors 119, during discharge, varies between 0.0 and 0.4 volts, and that approximately one fourth of the element capacitors 119 are discharging to the output circuit 143 at all times, the total voltage output of the photovoltaic array for the photovoltaic cells connected in series will be approximately 120 volts DC.

For a preferred embodiment, the capacitor charge switches 128 and the capacitor discharge switches 130 may be operated by the photovoltaic controller 103 to provide for each group of photovoltaic element capacitors 119 that are to be discharged in series, to be first connected in parallel to provide for equalization of the voltage on each capacitor. This prevents the lowest voltage capacitor in the series from limiting the current when the capacitors are switched to discharging in series.

For capacitors connected in series, the current is the same at all points in the interconnecting circuit, and thus the current is the same to and from each capacitor. If independently charged capacitors are switched to series connection, the capacitor with the least voltage differential between the cathode and the anode at the time of the initial switching to a series configuration will determine the current flow from the series of capacitors. Further, the total charge discharged from the capacitor series, will be limited to the total charge stored in the capacitor of the series with the least total charge. Therefore, in order to maximize the discharge current and total charge discharged from independently charged capacitors of the same characteristics and capacitance, and hence the total energy discharged, the capacitors should be connected in parallel, immediately before connecting them in series, for equalization of the voltage and charge stored on each of the capacitors. When the capacitors of uniform characteristics and capacitance are then connected in series, the voltage differential across each of the capacitors will be the same, resulting in the current, and hence the power and total energy discharged being maximized. The capacitors can ultimately all be fully discharged, if full discharge is desired for the overall operation, or will be discharged to the same level at the time that discharge is terminated by switches controlling the charging and discharging of the capacitors. If the voltage across each capacitor is V after being connected in parallel, if there are 3 capacitors, then the voltage experienced by the series of capacitors will be 3V. The current flowing from the series of capacitors will depend on the nature of the load that the series is connected to. If the load is a battery that is being recharged, then the discharge rate of the capacitor series will be dependent upon the battery charging rate.

Following are the formulas for capacitance for interconnected capacitors for a series and for a parallel configuration of capacitors.

$$1/Ct = 1/C1 + 1/C2 + \ldots + 1/Cn \text{ Series}$$

$$Ct = C1 + C2 + \ldots + Cn \text{ Parallel}$$

$$I = C\, dv/dt$$

The DC current may be input to an inverter which will generate a pulse alternating current with a voltage of approximately 120 volts AC. The inverter current output may be input to a filter which will impose a sinusoidal waveform on the AC current. Similarly, the photovoltaic controller can be programmed to control the photovoltaic capacitor switches so as to maintain a photovoltaic array output voltage within a desired target range so as to be compatible with the needed output of an attached inverter. Similarly, the voltage may be controlled by the photovoltaic controller 103 to maintain a photovoltaic array output voltage that will provide for the charging of one or more batteries attached to the output circuit 143.

It is anticipated, based upon current technology, that the capacitors, switches, voltage sensors, and circuit connections between these components, will be components of an integrated circuit in which the photovoltaic cells are imbedded. The utilization of additional capacitors, switches and voltage sensors for embodiments with a larger number of capacitors for each photovoltaic cell, would certainly increase the cost of the photovoltaic controller of the present invention.

For alternative preferred embodiments of the present invention, the interconnection between the voltage sensors 120 and the photovoltaic controller 103 may be wireless. Similarly, the interconnection between the photovoltaic controller 103 and the switches may be wireless.

For preferred embodiments, the photovoltaic controller 103 may receive continuous voltage measurements, or voltage measurements made at intervals, from the voltage sensors 120 of each photovoltaic cell 1 of a photovoltaic array, and use the voltage data to control the switches so as to attempt to optimize the output power production for the photovoltaic array, while providing for connecting the discharge output of each photovoltaic cell 1 to the output circuit 143. The current (I) flowing from each photovoltaic cell 1 may also be measured continuously, or at intervals, by a cell current sensor 171, and the current data transmitted to the photovoltaic controller 103. This current data may be used, along with the voltage data, by the photovoltaic controller 103 to attempt to optimize the output power production for the photovoltaic array.

For a preferred embodiment, the photovoltaic controller 103 may incorporate a digital computer and may communicate by wire or wireless with the capacitor voltage sensors to receive voltage measurements and may communicate by wire or wireless with the charge switches and the discharge switches to cause the switches to open and close as needed to manage the charging and discharging of the photovoltaic element capacitors 119 so as to optimize the energy extraction of the photovoltaic array and to control the voltage and other characteristics of the output from the photovoltaic array so as to appropriately interface with storage, electric grid or other application for the extracted solar energy. For a preferred embodiment, the capacitor switches 128 may be operated by the photovoltaic controller 103 to provide for each group of photovoltaic element capacitors 119 that are to be discharged in series, to be first connected in parallel to provide for equalization of the voltage on each capacitor. This prevents the lowest voltage capacitor in the series from limiting the current when the capacitors are switched to discharging in series.

Figure 10:
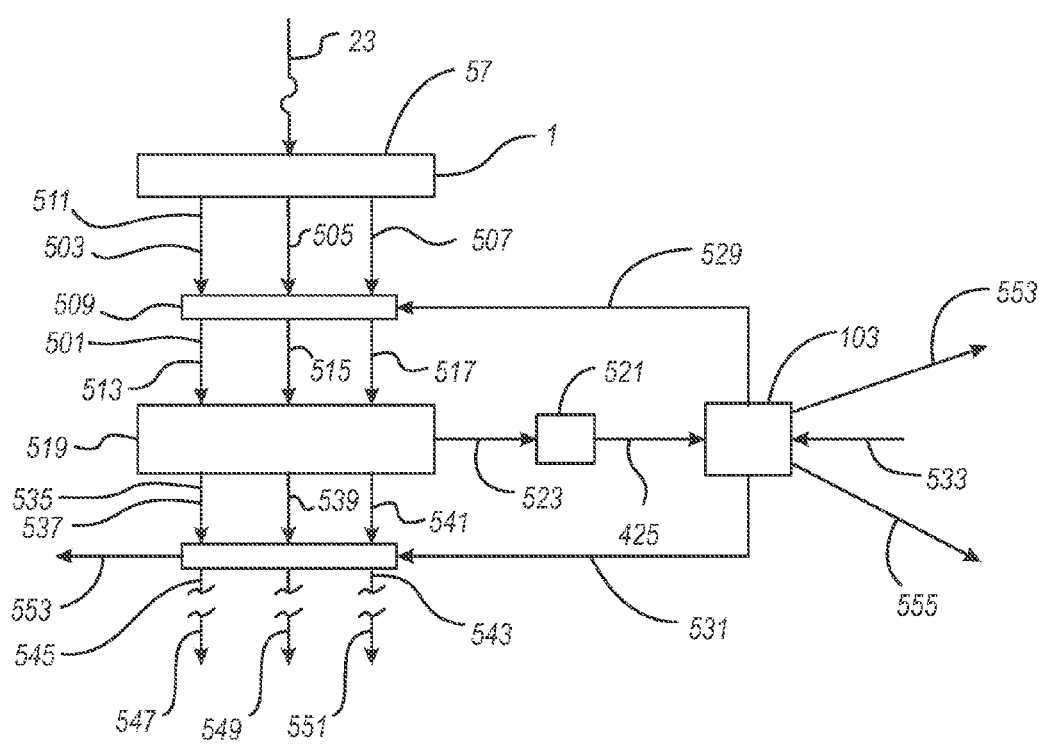
FIG. 10 is a general flow diagram schematic of the apparatus and method of the multi-element photovoltaic cell and photovoltaic cell assembly of the present invention.

Referring now to FIG. 10, a general flow diagram schematic of the apparatus and method of the multi-element photovoltaic cell 1 and photovoltaic cell assembly 57 of the present invention is shown. So as long as the irradiation of the photovoltaic cell 1 continues, the cell current 501 will be produced from each photovoltaic element as described above. If there are three photovoltaic elements as shown for the embodiments illustrated in FIG. 3 and FIG. 5 as described above, the cell current 501 will be comprised of a first element current 503, a second element current 505, and a third element current 507, a cell switch assembly 509, as controlled by the photovoltaic controller 103 directs the cell current 501, namely the first element current 503, the second element current 505, and the third element current 507, by the operation of a number of charging switches to flow as switched current 511 which is comprised of switched first element current 513 switched second element current 515 and switched third element current 517, to element capacitor bank 519, comprised of a plurality of element capacitors. Element capacitor voltage 523 of each element capacitor is monitored by a voltage sensor bank 521, comprised of a plurality of capacitor voltage sensors. As discussed above, at least three element capacitors are preferred for each photovoltaic element 3 in order to maintain a desirable level of efficiency for charging and discharging the capacitors and the overall energy collection efficiency of the photovoltaic cell assembly 57. Likewise an element capacitor voltage sensor is preferred for each element capacitor.

Voltage sensor output signals 525 preferably are transmitted to the photovoltaic controller 103. The photovoltaic controller 103 transmits capacitor charge switch control signals 529 to the respective capacitor charge switches, in directing the cells switched current 511, namely the switched first element current 513 switched second element current 515 and switched third element current 517, to the plurality of photovoltaic element capacitors contained in the capacitor bank 519 in a manner so as to optimize the handling of the charge generated by each of the photovoltaic elements of the photovoltaic cell 1.

Similarly, the element capacitor voltage signal output signals 525 are utilized by the photovoltaic controller 103 to generate capacitor discharge switch signals 531, which are transmitted to the element capacitor discharge switch assembly 543. The plurality of discharge switches contained in the element capacitor discharge switch assembly 543 directs the capacitor bank discharge current 535, namely the first element discharge current 537, the second element discharge current 539, and the third element discharge current 541, and directs the cell output current 545, which may be comprised of the first element output current 547, the second element output current 549 and the third element output current 551. The output current 545, including any or all of the first element output current 547, the second element output current 549 and the third element output current 551 may be connected in parallel, series or combination thereof with other capacitors of the photovoltaic cell assembly 557, to a load, to a photovoltaic array charge storage system or to an output circuit. The photovoltaic controller 103 may provide for all or a portion of the current from of the element capacitor discharge assembly 543 to be discharged as a composite cell output current 553, which may be directed to a load, to a charge storage unit of a photovoltaic array, or to a discharge circuit. Alternatively, the output from a photovoltaic cell assembly 57 may be directed by the photovoltaic controller 103 by the use of cell discharge switches 400 as shown in FIG. 5 and FIG. 6, through an inverter, for the production of the current for discharge to an electric power grid.

The photovoltaic controller 103 of the photovoltaic cell assembly 57 of the present invention may also provide for the concurrent operation of a plurality of photovoltaic cell assemblies 57, such as would be present in a photovoltaic array. The photovoltaic cell assembly 57 may receive voltage sensor signals 533 from a plurality of other photovoltaic cell assemblies, such as for a photovoltaic array of which the photovoltaic cell assembly 57 of the present invention is a component, and may generate charging signals 553 and discharging switch control signals 555, which are directed to a plurality of photovoltaic cell assemblies which are operated in conjunction with the photovoltaic cell assembly 57 of the present invention, as in a photovoltaic array. In general, the photovoltaic controller will operate element capacitor charging switches and element capacitor discharging switches for each of the photovoltaic cell assemblies 57 so as to optimize the charging assembly and power and total energy output of photovoltaic array or which the photovoltaic cell assembly 57 of the present invention is a part.

Referring further to FIG. 5 and FIG. 6, the photovoltaic controller 103 may control a plurality of cell discharge switches 400, which, for the embodiment shown, may comprise first element discharge switches 401, 403, 407, 409, second element discharge switches 411, 413, 415, 417, and third element discharge switches 419, 421, 423, 425, which may direct the current generated by each of the photovoltaic elements 3 of the photovoltaic cell 1 so as to maximize the overall efficiency of the photovoltaic cell 1. Further, the photovoltaic controller may control the cell discharge switches 400 of the photovoltaic cell 1 along with the cell discharge switches of other photovoltaic cells of a photovoltaic array, so as to attempt to maximize the overall efficiency of the photovoltaic array and attempt to achieve voltage discharge conditions for a photovoltaic array in which the photovoltaic cell 1 of the present invention is incorporated. The photovoltaic elements 3 may be discharged to a load, charge storage device, or an interconnection with other photovoltaic cells or photovoltaic cell assemblies concurrently in series from photovoltaic cell assembly cathode 435 and photovoltaic cell assembly anode 437. Each of the photovoltaic elements 3 may also be discharged independently, in parallel, or in series to a load, charge storage device, or interconnection with other photovoltaic cells or photovoltaic cell assemblies from photovoltaic cell cathodes 431 and photovoltaic cell anodes 433.

In view of the disclosures of this specification and the drawings, other embodiments and other variations and modifications of the embodiments described above will be obvious to a person skilled in the art. Therefore, the foregoing is intended to be merely illustrative of the invention and the invention is limited only by the following claims and the doctrine of equivalents.

What is claimed is:

1. A photovoltaic cell assembly comprising:
   a plurality of photovoltaic elements, comprising at least a first photovoltaic element and a last photovoltaic element, each photovoltaic element comprising a photovoltaic layer and a pair of layer conductors, a layer front conductor and a layer rear conductor, the photovoltaic layer being interposed between the layer front conductor and the layer rear conductor, the layer front conductor and the layer rear conductor being in electrical contact with the photovoltaic layer, each photovoltaic layer having a layer bandgap which differs from the layer bandgap of the other photovoltaic layers, and each photovoltaic layer having a cell element anode and a cell element cathode;
   one or more isolation layers, a respective isolation layer being interposed between contiguous photovoltaic elements;
   a capacitor charge circuit electrically connected to each photovoltaic element;
   a respective plurality of element capacitors electrically connected to each photovoltaic element by the capacitor charge circuit, each element capacitor having two capacitor electrodes, a capacitor cathode and a capacitor anode;
   a respective plurality of capacitor charge switches electrically connected in the capacitor charge circuit to each photovoltaic element, a respective capacitor charge switch being electrically connected in the capacitor charge circuit between the cell element cathode and the capacitor cathode of a respective element capacitor, and another respective capacitor charge switch being electrically connected in the capacitor charge circuit between the cell element anode and the capacitor anode of the respective element capacitor,
   a capacitor discharge circuit electrically connected to each element capacitor,
   an output circuit electrically connected to the capacitor discharge circuit;
   a respective plurality of capacitor discharge switches connected in the capacitor discharge circuit to each element capacitor, a respective capacitor discharge switch being electrically connected in the capacitor discharge circuit between the capacitor cathode of the respective element capacitor and the output circuit, and another respective capacitor discharge switch being electrically connected in the capacitor discharge circuit between the capacitor anode of the respective element capacitor and the output circuit;
   a plurality of capacitor voltage sensors, each of the voltage sensors being electrically connected to the respective element capacitor, and
   a photovoltaic controller in communication with the capacitor voltage sensors, the capacitor charge switches and the capacitor discharge switches, and providing for control of the capacitor charge switches and capacitor discharge switches.

2. The photovoltaic cell assembly recited in claim 1 wherein one or more of the layer rear conductors comprise a doped conduction zone in the respective photovoltaic layer.

3. The photovoltaic cell assembly recited in claim 1 wherein the photovoltaic controller has a capability for switching each element capacitor of a respective photovoltaic element between a parallel connection and a series connection with other element capacitors of the photovoltaic element in accordance with a control algorithm.

4. The photovoltaic cell assembly recited in claim 1 wherein the photovoltaic controller has a capability for switching each element capacitor of a respective photovoltaic element between a parallel connection and a series connection with other element capacitors of the photovoltaic element or element capacitors of one or more of the other photovoltaic elements in accordance with a control algorithm.

5. The photovoltaic cell assembly recited in claim 1 wherein each photovoltaic element has a capacitor bank incorporating the element capacitors of the photovoltaic element and the photovoltaic controller has a capacity for controlling the capacitor charge switches and the capacitor discharge switches and a capability for switching each capacitor bank between a parallel connection and a series connection with other capacitor banks in accordance with a control algorithm.

6. The photovoltaic cell assembly recited in claim 1 wherein the photovoltaic controller has a capability for switching each element capacitor between one or more parallel configurations and one or more series configurations with other element capacitors of respective photovoltaic elements in accordance with a control algorithm.

7. The photovoltaic cell assembly recited in claim 1 wherein the photovoltaic controller has a capability for providing a parallel connection or a series connection between respective element capacitors of one or more photovoltaic elements with element capacitors of other photovoltaic cell assemblies, in accordance with a control algorithm.

8. The photovoltaic cell assembly recited in claim 1 wherein the photovoltaic controller has a capability for switching one or more element capacitors of a photovoltaic element between one or more parallel configurations and one or more series configurations with one or more other element capacitors of the photovoltaic element, with one or more respective element capacitors of one or more other photovoltaic elements of the photovoltaic cell assembly, or with one or more respective element capacitors of one or more photovoltaic elements of one or more other cell element assemblies, in accordance with a control algorithm.

9. The photovoltaic controller recited in claim 1 further comprising a cell current sensor electrically connected to the capacitor charge circuit, the cell current sensor being in communication with the photovoltaic controller.

10. The photovoltaic controller recited in claim 1 wherein the photovoltaic controller incorporates a digital computer with a control algorithm.

11. A photovoltaic cell assembly comprising:
a plurality of photovoltaic elements, comprising at least a first photovoltaic element and a last photovoltaic element, each photovoltaic element comprising a photovoltaic layer and a pair of layer conductors, a layer front conductor and a layer rear conductor, the photovoltaic layer being interposed between the layer front conductor and the layer rear conductor, the layer front conductor and the layer rear conductor being in electrical contact with the photovoltaic layer, each photovoltaic layer having a layer bandgap which differs from the layer bandgap of the other photovoltaic layers, and each photovoltaic layer having a cell element anode and a cell element cathode;
one or more isolation layers, a respective isolation layer being interposed between contiguous photovoltaic elements;
a capacitor charge circuit electrically connected to each photovoltaic element;
a respective plurality of element capacitors electrically connected to each photovoltaic element by the capacitor charge circuit, each element capacitor having two capacitor electrodes, a capacitor cathode and a capacitor anode;
a respective plurality of capacitor charge switches electrically connected in the capacitor charge circuit to each photovoltaic element, a respective capacitor charge switch being electrically connected in the capacitor charge circuit between the cell element cathode and the capacitor cathode of a respective element capacitor, and another respective capacitor charge switch being electrically connected in the capacitor charge circuit between the cell element anode and the capacitor anode of the respective element capacitor,
a capacitor discharge circuit electrically connected to each element capacitor,
an output circuit electrically connected to the capacitor discharge circuit;
a respective plurality of capacitor discharge switches connected in the capacitor discharge circuit to each element capacitor, a respective capacitor discharge switch being electrically connected in the capacitor discharge circuit between the capacitor cathode of the respective element capacitor and the output circuit, and another respective capacitor discharge switch being electrically connected in the capacitor discharge circuit between the capacitor anode of the respective element capacitor and the output circuit;
a plurality of capacitor voltage sensors, each of the voltage sensors being electrically connected to the respective element capacitor, and
a photovoltaic controller in communication with the capacitor voltage sensors, the capacitor charge switches and the capacitor discharge switches, and having a capability for controlling the capacitor charge switches and the capacitor discharge switches in accordance with a control algorithm.

12. The photovoltaic cell assembly recited in claim 11 wherein one or more of the layer rear conductors comprise a doped conduction zone in the respective photovoltaic layer.

13. The photovoltaic cell assembly recited in claim 11 wherein the photovoltaic controller has a capability for switching one or more element capacitors between one or more parallel configurations and one or more series configurations with one or more other element capacitors of the respective photovoltaic elements in accordance with the control algorithm.

14. The photovoltaic cell assembly recited in claim 11 wherein the photovoltaic controller has a capability for switching one or more element capacitors of a respective photovoltaic element between a parallel connection and a series connection with one or more other element capacitors of the photovoltaic element in accordance with the control algorithm.

15. The photovoltaic cell assembly recited in claim 11 wherein the photovoltaic controller has a capability for switching each element capacitor of a respective photovoltaic element between a parallel connection and a series connection with other element capacitors of the photovoltaic element or element capacitors of one or more of the other photovoltaic elements in accordance with the control algorithm.

16. The photovoltaic cell assembly recited in claim 11 wherein each photovoltaic element has a capacitor bank incorporating the element capacitors of the photovoltaic element and a capability for switching each capacitor bank between a parallel connection and a series connection with other capacitor banks in accordance with the control algorithm.

17. The photovoltaic cell assembly recited in claim 11 wherein the photovoltaic controller has a capability for switching each element capacitor between one or more parallel configurations and one or more series configurations with other element capacitors of respective photovoltaic elements in accordance with the control algorithm.

18. The photovoltaic cell assembly recited in claim 11 wherein the photovoltaic controller has a capability for controlling the capacitor charge switches and the capacitor discharge switches and has a capability for providing a parallel connection or a series connection between respective element capacitors of one or more photovoltaic elements with element capacitors of other photovoltaic cell assemblies, in accordance with the control algorithm.

19. The photovoltaic cell assembly recited in claim 11 wherein the photovoltaic controller has a capability for switching one or more element capacitors of a photovoltaic element between one or more parallel configurations and one or more series configurations with one or more other element capacitors of the photovoltaic element, with one or more respective element capacitors of one or more other photovoltaic elements of the photovoltaic cell assembly, or with one or tore respective element capacitors of one or more photovoltaic elements of one or more other cell element assemblies, in accordance with the control algorithm.

20. The photovoltaic cell assembly recited in claim 11 wherein the photovoltaic controller has a capability for switching each element capacitor between one or more parallel configurations and one or more series configurations with other element capacitors of respective photovoltaic elements, respective element capacitors of respective photovoltaic elements of the photovoltaic cell assembly, or respective element capacitors of respective photovoltaic elements of respective cell element assemblies, in accordance with the control algorithm.

21. The photovoltaic controller recited in claim 11 further comprising a cell current sensor electrically connected to the capacitor charge circuit, the cell current sensor being in communication with the photovoltaic controller.

22. The photovoltaic controller recited in claim 11 wherein the photovoltaic controller incorporates a digital computer with a control algorithm.

23. A method for improving the output power production of a photovoltaic cell assembly of a plurality of photovoltaic elements, each photovoltaic element having a photovoltaic layer, an element anode and an element cathode, each photovoltaic layer having a layer bandgap which differs from the layer bandgap of the other photovoltaic layers, and each photovoltaic layer having a cell element anode and a cell element cathode the method comprising:

interposing a pair of layer conductors for each photovoltaic layer, a layer front conductor and a layer rear conductor, the photovoltaic layer being interposed between the layer front conductor and the layer rear conductor, the layer front conductor and the layer rear conductor being in electrical contact with the photovoltaic layer, interposing one or more isolation layers, a respective isolation layer being interposed between contiguous photovoltaic elements;

connecting a respective plurality of element capacitors to each photovoltaic element by a capacitor charge circuit, each element capacitor having two capacitor electrodes, a capacitor cathode and a capacitor anode;

providing a respective plurality of capacitor charge switches for selectively charging the respective element capacitors of each photovoltaic layer, a respective capacitor charge switch being electrically connected in the capacitor charge circuit between the element cathode and the capacitor cathode of a respective element capacitor, and another respective capacitor charge switch being electrically connected in the capacitor charge circuit between the element anode and the capacitor anode of the respective element capacitor, monitoring a capacitor voltage across each element capacitor using a plurality of voltage sensors, one of the respective voltage sensors being electrically connected to a respective element capacitor, connecting the element capacitors to an output circuit by a capacitor discharge circuit;

providing a respective plurality of capacitor discharge switches for selectively discharging the respective element capacitors, a respective capacitor discharge switch being electrically connected in the capacitor discharge circuit between the capacitor cathode of the respective element capacitor and the output circuit, and another respective capacitor discharge switch being electrically connected in the capacitor discharge circuit between the capacitor anode of the respective element capacitor and the output circuit; and using a photovoltaic controller in communication with the capacitor voltage sensors, the capacitor charge switches, and the capacitor discharge switches, to control an operation of the respective capacitor charge switches and an operation of the respective capacitor discharge switches, to optimize the power output of the photovoltaic array using the capacitor voltages measured by the voltage sensors.

24. The method recited in claim 23 further comprising measuring a current from each photovoltaic cell using a respective cell current sensor electrically connected to the capacitor charge circuit, each of the cell current sensors being in communication with the photovoltaic controller, and the photovoltaic controller using the measured current for each photovoltaic cell in controlling the operation of the capacitor charge switches and the operation of the capacitor discharge switches in optimizing the power output of the photovoltaic array.

25. The method recited in claim 23 wherein the photovoltaic controller incorporates a digital computer with a control algorithm.

26. The method recited in claim 23 wherein one or more of the layer rear conductors comprise a doped conduction zone in the respective photovoltaic layer.

27. The method recited in claim 23 wherein the photovoltaic controller is used to switch between a parallel connection and a series connection between respective element capacitors of respective photovoltaic elements in accordance with a control algorithm.

28. The method recited in claim 23 wherein the photovoltaic controller is used to switch each element capacitor between one or more parallel configurations and one or more series configurations with one or more other element capacitors of respective photovoltaic elements in accordance with a control algorithm.

29. The method recited in claim 23 wherein the photovoltaic controller is used to switch between a parallel connection and a series connection between respective element capacitors of respective photovoltaic elements, and to provide a parallel connection or a series connection between respective element capacitors of one or more photovoltaic elements of other photovoltaic cell assemblies, in accordance with a control algorithm.

30. The method recited in claim 23 wherein the photovoltaic controller is to switch between one or more parallel configurations and one or more series configurations of one or more element capacitors with one or more other element capacitors of the photovoltaic element, one or more element capacitors of one or more other photovoltaic elements of the photovoltaic cell assembly, or one or more element capacitors of one or more photovoltaic elements of one or more other photovoltaic cell assemblies, in accordance with a control algorithm.

31. A method for improving the output power production of a photovoltaic array of a plurality of photovoltaic cells, each photovoltaic cell comprising a plurality of photovoltaic elements, each photovoltaic element comprising a photovoltaic layer and a pair of layer conductors, a layer front conductor and a layer rear conductor, the photovoltaic layer being interposed between the layer front conductor and the layer rear conductor, the layer front conductor and the layer rear conductor being in electrical contact with the photovoltaic layer, each photovoltaic layer having a layer bandgap which differs from the layer bandgap of the other photovoltaic layers, and each photovoltaic layer having a cell element anode and a cell element cathode, the method comprising:

interposing a pair of layer conductors for each photovoltaic layer, a layer front conductor and a layer rear conductor, the photovoltaic layer being interposed between the layer front conductor and the layer rear conductor, the layer front conductor and the layer rear conductor being in electrical contact with the photovoltaic layer;

interposing one or more isolation layers, a respective isolation layer being interposed between contiguous photovoltaic elements;

providing a capacitor bank comprised of a plurality of element capacitors and connecting each photovoltaic element of each photovoltaic cell to the capacitor bank by a capacitor charge circuit, each element capacitor having two capacitor electrodes, a capacitor cathode and a capacitor anode;

providing a plurality of capacitor charge switches for selectively connecting the photovoltaic elements of each photovoltaic cell to the element capacitors through the capacitor charge circuit, and selectively charging the element capacitors from the photovoltaic elements;

monitoring a capacitor voltage across each element capacitor using a plurality of voltage sensors, one of the respective voltage sensors being electrically connected to a respective element capacitor, connecting the element capacitors of each photovoltaic to an output circuit by a capacitor discharge circuit;

providing a plurality of capacitor discharge switches electrically connected in the capacitor discharge circuit for selectively connecting the element capacitors to the output circuit and selectively discharging the element capacitors to the output circuit; and using a photovoltaic controller in communication with the capacitor voltage sensors, the capacitor charge switches, and the capacitor discharge switches, to control an operation of the respective capacitor charge switches and an operation of the respective capacitor discharge switches using the capacitor voltages measured by the voltage sensors, to improve the power output of the photovoltaic array.

32. The method recited in claim 31 further comprising measuring a current from each photovoltaic cell using a respective cell current sensor electrically connected to the capacitor charge circuit, each of the cell current sensors being in communication with the photovoltaic controller, and the photovoltaic controller using the measured current for each photovoltaic cell in controlling the operation of the capacitor charge switches and the operation of the capacitor discharge switches in improving the power output of the photovoltaic array.

33. The method recited in claim 31 wherein the photovoltaic controller incorporates a digital computer with a control algorithm.

34. The method recited in claim 31 wherein one or more of the layer rear conductors comprise a doped conduction zone in the respective photovoltaic layer.

35. The method recited in claim 31 wherein the photovoltaic controller is used to control the capacitor charge switches and the capacitor discharge switches and is used to switch between a parallel connection and a series connection between respective element capacitors in accordance with a control algorithm.

36. The method recited in claim 31 wherein the photovoltaic controller is used to control the capacitor charge switches and the capacitor discharge switches and is used to switch each element capacitor between one or more parallel configurations and one or more series configurations with other element capacitors in accordance with a control algorithm.

* * * * *